United States Patent

Nomura et al.

[11] Patent Number: 5,920,454
[45] Date of Patent: Jul. 6, 1999

[54] CAPACITOR-MOUNTED CIRCUIT BOARD

[75] Inventors: Kazuo Nomura; Nobutsugu Nakanuma; Ichiro Ishiyama; Koji Higashi; Masaki Kato; Ichiro Nagare; Hiroyuki Kurokawa; Yozo Ohara, all of Toyama-ken, Japan

[73] Assignee: Hokuriko Electric Industry Co., Ltd., Japan

[21] Appl. No.: 08/798,650

[22] Filed: Feb. 11, 1997

[51] Int. Cl.[6] .............................. H01K 4/06; H01K 4/002
[52] U.S. Cl. ........................ 361/313; 361/765; 361/766
[58] Field of Search ............................ 361/763, 765, 361/766, 782, 305, 306.1, 306.3, 311, 312, 313, 321.2, 303, 328, 329; 428/325, 322.7, 339, 164

[56] References Cited

U.S. PATENT DOCUMENTS 3,644,166  2/1972  Gause ........................................ 428/336
4,731,695  3/1988  Brown et al. ............................. 361/313

FOREIGN PATENT DOCUMENTS 101153   8/1979  Japan .
215194   8/1990  Japan .
 65651  10/1991  Japan .

Primary Examiner—Kristine L. Kincaid
Assistant Examiner—Anthony Dinkins
Attorney, Agent, or Firm—Rankin, Hill, Porter & Clark LLP

[57] ABSTRACT

A printed capacitor-mounted circuit board capable of increasing a capacity of each of printed capacitors formed on a printed board. A copper-clad laminate is arranged so as to act as an insulating substrate. The printed capacitors each include a first electrode made of a copper foil and arranged on a front surface of the copper-clad laminate. Then, a dielectric layer made of a dielectric paste is arranged on the first electrode and a second electrode made of a conductive paint is arranged on the dielectric layer.

10 Claims, 4 Drawing Sheets ically manufac-
CAPACITOR-MOUNTED CIRCUIT BOARD

BACKGROUND OF THE INVENTION

This invention relates to a capacitor-mounted circuit board, and more particularly to a printed capacitor-mounted circuit board which has a printed capacitor mounted thereon.

A conventional printed capacitor is typtured in such a manner that a glass/silver paint used for formation of a first electrode made of silver is printed on a ceramic green sheet and a dielectric paste is coated on the glass/silver paint, followed by calcination of the ceramic green sheet, glass/silver paint and dielectric paste at an elevated temperature as high as about 900° C., resulting in a ceramic substrate, a first electrode and a dielectric layer being formed. Then, a second electrode made of silver is formed on the dielectric layer to complete the printed capacitor. Thus, use of ceramic for the substrate requires calcination at an elevated temperature; however, this permits the dielectric layer to be increased in dielectric constant, so that the capacitor may be provided with a relatively increased capacity. Additional techniques for forming such a printed capacitor are also known in the art, which are adapted to print a capacitor on a printed substrate such as a glass/epoxy substrate or the like. The techniques are so constructed that a conductive paste such as a resin/silver paste or the like is formed on the printed substrate to form a first electrode and then a dielectric paste is coated on the thus-formed first electrode to form a dielectric layer, on which a conductive paste is coated to form a second electrode, resulting in a printed capacitor-mounted circuit board being provided.

Formation of the printed capacitor on the ceramic substrate permits the printed capacitor to be increased in capacity, however, it causes the printed capacitor-mounted circuit board to be highly increased in manufacturing cost. In particular, large-sizing of the ceramic substrate leads to a substantial increase in manufacturing cost of the circuit board. Also, the ceramic substrate is not suitable for multi-layering of the circuit board or for construction of the circuit board into a multilayered structure.

Although the printed capacitor-mounted circuit board wherein the printed capacitor is formed on the printed substrate fails to highly increase a capacity of the printed capacitor, it significantly reduces a manufacturing cost thereof and can be multi-layered.

However, formation of the conductive paste into the first electrode in the printed capacitor-mounted circuit board causes conductive powders or particles of the paste to bite into the dielectric layer, to thereby prevent the printed capacitor from being increased in capacity.

SUMMARY OF THE INVENTION

The present invention has been made in view of the foregoing disadvantage of the prior art.

Accordingly, it is an object of the present invention to provide a printed capacitor-mounted circuit board which is capable of increasing a capacity of the printed capacitor while using a printed substrate.

It is another object of the present invention to provide a multilayered circuit board which includes a printed capacitor-mounted circuit board which is capable of increasing a capacity of the printed capacitor while using a printed substrate.

It is a further object of the present invention to provide a printed capacitor-mounted circuit board which is capable of effectively preventing breaking or cutting of a connection wire or line even when a copper-clad laminate is used.

It is still another object of the present invention to provide a printed capacitor-mounted circuit board which is capable of preventing breaking or cutting of a connection line connected to a second electrode of the printed capacitor while reducing the number of times of printing.

It is yet another object of the present invention to provide a printed capacitor-mounted circuit board which is capable of facilitating formation of an undercoat for a connection line connected to a second electrode of the printed capacitor.

It is even another object of the present invention to provide a printed capacitor-mounted circuit board which is capable of minimizing migration of an ingredient for a component of the printed capacitor.

It is a still further object of the present invention to provide a printed capacitor-mounted circuit board which is capable of increasing a capacity of the printed capacitor.

It is a yet further object of the present invention to provide a printed capacitor-mounted circuit board which is capable of facilitating correction of a capacitor of the printed capacitor.

It is an even further object of the present invention to provide a printed capacitor-mounted circuit board which is capable of minimizing a variation in capacitor of the printed capacitor.

In accordance with one aspect of the present invention, a capacitor-mounted circuit board is provided. The capacitor-mounted circuit board includes an insulating substrate having one or more than one printed capacitor arranged on a front surface thereof. The insulating substrate is constructed of a copper-clad laminate. The printed capacitor includes a first electrode made of a copper foil and arranged on a front surface of the copper-clad laminate, a dielectric layer made of a dielectric paste and arranged on the first electrode, and a second electrode made of a conductive paint and arranged on the dielectric layer.

In a preferred embodiment of the present invention, when the first electrode is made of a copper foil, the second electrode may be connected to a connection made of a copper foil and arranged on the front surface of the copper-clad laminate by means of a connection line made of a conductive paint. In this instance, there is likelihood that the connection line is cut or broken by an angular portion of an end of the copper foil. In order to avoid such a disadvantage, the dielectric layer may include an extension extending beyond the first electrode so as to prevent the connection line from being cut by the angular portion of the end of the first electrode.

In a preferred embodiment of the present invention, the extension of the dielectric layer is arranged so as to provide an undercoat for the connection line.

In a preferred embodiment of the present invention, the copper-clad laminate is formed thereon with at least one of at least one printed resistor and at least one inductance made of a copper foil.

In a preferred embodiment of the present invention, the connection which is made of a copper foil and to which the printed resistor is electrically connected is provided on the angular portion thereof with a cushioning layer. The cushioning layer is made of the conductive paint for the second electrode of the printed capacitor and the printed resistor has an undercoat made of the dielectric paste for the dielectric layer.

In a preferred embodiment of the present invention, the second electrode is made of a copper/silver paste.

In a preferred embodiment of the present invention, the dielectric paste is made by kneading a mixture of a binder and titanate such as barium titanate, strontium titanate or the like. Resin binder is used as the binder.

In a preferred embodiment of the present invention, the printed capacitor has a sheet-like capacitor connected in parallel thereto, wherein the sheet-like capacitor is fittedly arranged in a recess formed on the copper-clad laminate in a manner to be in proximity to the printed capacitor.

In a preferred embodiment of the present invention, the sheet-like capacitor includes a sheet-like dielectric layer, and first and second sheet-like capacitor electrodes respectively arranged on both surfaces of the dielectric layer. Also, the sheet-like capacitor is so arranged that the first sheet-like capacitor electrode faces the recess, wherein the recess is formed therein with a connection electrode which is electrically connected to the first electrode of the printed capacitor and electrically connected to the first sheet-like capacitor electrode, and the second sheet-like capacitor electrode and the second electrode of the printed capacitor are connected to each other by means of a connection pattern made of a conductive paint.

In accordance with another aspect of the present invention, a multilayered circuit board structure is provided. The multilayered circuit board includes a plurality of circuit boards laminated on each other through at least one prepreg, wherein the circuit boards include such a capacitor-mounted circuit board as described above which acts as an inner layer in the multilayered circuit board structure. The capacitor-mounted circuit board has an overcoat made of epoxy resin and arranged so as to cover at least a printed capacitor of the capacitor-mounted circuit board.

BRIEF DESCRIPTION OF THE DRAWINGS

These and other objects and many of the attendant advantages of the present invention will be readily appreciated as the same becomes better understood by reference to the following detailed description when considered in connection with the accompany drawings; wherein.

DETAILED DESCRIPTION OF THE PREFERRED EMBODIMENTS

Now, a printed capacitor-mounted circuit board according to the present invention will be described hereinafter with reference to the accompanying drawings.

Figure 1:
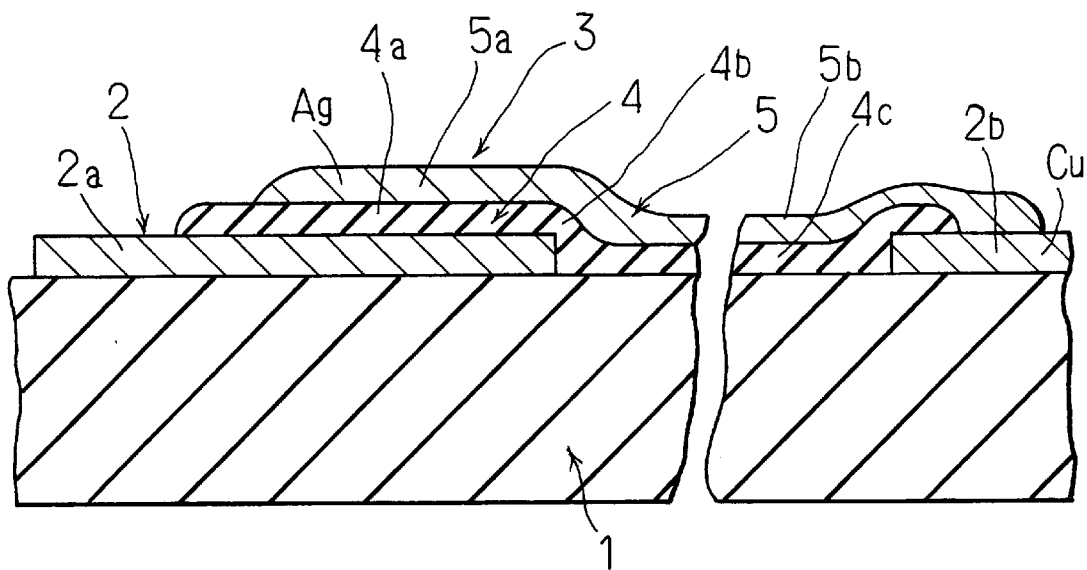
FIG. 1 is a fragmentary enlarged sectional view showing an essential part of an embodiment of a printed capacitor-mounted circuit board according to the present invention.
Figure 2:
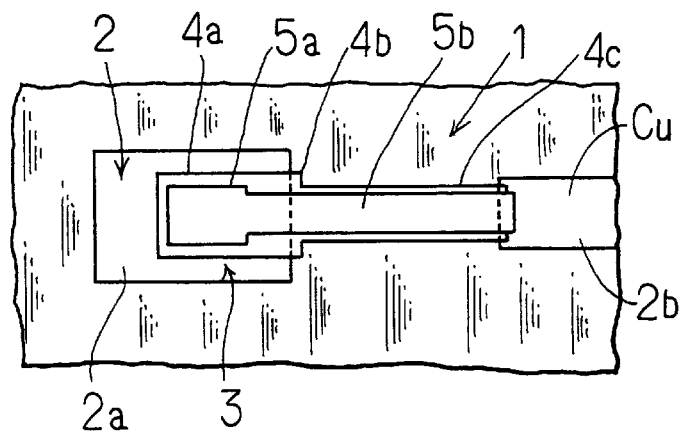
FIG. 2 is a fragmentary plan view shown an essential part of the printed capacitor-mounted circuit board of FIG. 1.

Referring first to FIGS. 1 and 2, an embodiment of a printed capacitor-mounted circuit board according to the present invention is illustrated. A printed capacitor-mounted circuit board of the illustrated embodiment generally includes a copper-clad laminate 1 having a circuit pattern made of a copper foil and formed on a front surface thereof, one or more than one printed capacitor 3, a dielectric coated layer 4 made of a dielectric paint or a dielectric paste, and a conductive paint or coated layer 5 made of a conductive paint. In the illustrated embodiment, a plurality of the printed capacitors 3 are arranged on the copper-clad laminate 1.

In the illustrated embodiment, the copper-clad laminate 1 includes a glass/epoxy substrate and a copper foil superposed on one surface of the substrate. The copper foil is then subject to etching, resulting in the circuit pattern 2 being formed. In this instance, it is merely required that the copper-clad laminate 1 is provided on at least one surface thereof with the copper foil circuit. Thus, the copper foil circuit may be arranged on each of both surfaces of the copper-clad laminate 1. The substrate for the copper-clad laminate 1 is typically made of a material decreased in heat resistance such as glass/epoxy, polyimide or the like, therefore, it is required that techniques for forming the dielectric coated layer 4 and materials of the dielectric paint are selected within a range of a heat-resistance temperature of the substrate. The circuit pattern 2 includes a first electrode 2a for the printed capacitor 3 and a connection 2b to which a second electrode 5a for the printed capacitor 3 described hereinafter is connected.

In the illustrated embodiment, the first electrode 2a is formed into a rectangular shape, however, it may be formed into any other suitable shape. The dielectric coated layer 4 is formed so as to extend between the first electrode 2a and the connection 2b. The dielectric coated layer 4 is so arranged that a portion thereof formed on the first electrode 2a forms a dielectric layer 4a of the printed capacitor 3 and a portion thereof extending toward the connection 2b beyond a corner portion or angular portion of an end of the first electrode 2a forms an extension 4b. The remaining portion of the dielectric coated layer 4 provides an undercoat 4c of a connection line 5b. The undercoat 4c is arranged so as to cover an angular portion of the connection 2b. Such arrangement effectively prevents the connection line 5b from being broken or cut by the angular portion of the connection 2b made of a copper foil. The extension 4b covers the angular portion of the end of the first electrode 2a to render the angular portion gentle or smooth. In particular, formation of the extension 4b by the dielectric coated layer 4 eliminates a necessity of separately carrying out a printing operation for forming the extension 4b, to thereby permit manufacturing of the circuit board to be facilitated while reducing the number of steps in the manufacturing and the manufacturing cost.

The dielectric coated layer 4 is formed by screen-printing a dielectric paste on the copper-clad laminate 1 and then subjecting it to calcination at a predetermined temperature. The dielectric paste is made by kneading a mixture of a resin binder, a material of increased dielectric properties and a solvent. The materials of increased dielectric properties include titanates such as barium titanate, strontium titanate and the like. A calcination temperature at which the dielectric paste is calcined for formation of the dielectric coated layer 4 is limitedly set depending on a heat-resistant temperature of the copper-clad laminate 1. Thus, the calcination temperature cannot be set at a substantially high level. For example, the calcination may be carried out at a temperature as low as 200° C. or below. Such a low temperature renders an increase in capacity of the dielectric layer substantially difficult. In particular, formation of the dielectric layer by such low temperature calcination using conventional techniques requires to incorporate a resin binder in the dielectric paste. The resin binder remains in the dielectric layer after the calcination, so that a capacity of the printed capacitor and dielectric characteristics thereof, in particular, frequency characteristics thereof are varied depending on a capacity of both dielectric powder and binder and dielectric characteristics thereof. It was found that use of titanate such as barium titanate, strontium titanate or the like for this purpose provides the dielectric layer with a relatively high dielectric constant and the printed capacitor with satisfactory frequency characteristics even when such low temperature calcination is carried out.

Also, it was found that use of a binder increased in dielectric constant for the purpose of increasing a dielectric constant of the dielectric layer permits an increase in dielectric constant of the dielectric layer but causes frequency characteristics of the printed capacitor to be deteriorated. Thus, the resin binder preferably has a dielectric constant lower than that of the titanate. The resin binders include, for example, a cyano resin binder, a phenolic resin binder, an epoxy resin binder and the like.

The inventors made an experiment for forming such a dielectric paste. More specifically, a mixture of 76 wt % of barium titanate, 19 wt % of cyano resin and 5 wt % of solvent (dimethyl formamide) was kneaded to prepare a dielectric paste. Then, the dielectric paste was subject to calcination at 150° C. to thereby form the dielectric layer 4a, which had a dielectric constant of about 70. Also, a mixture of barium titanate and strontiun titanate was substituted for the above-described barium titanate and the same procedure was repeated. A dielectric powder calcined had a dielectric constant of 73. The cyano resin had a dielectric constant of about 10 and the dielectric coated layer 4 had a thickness of 10 to 30 µm.

The conductive coated layer 5, as described above, includes the second electrode 5a and connection line 5b. The second electrode 5a is arranged so as to be positioned above the first electrode 2a made of a copper foil and the connection line 5b is formed by a portion of the conductive coated layer 5 out of the first electrode 2a so as to connect the second electrode 5a to the connection 2b therethrough. In the illustrated embodiment, the first electrode 2a is formed by etching, so that a capacity of the printed capacitor is adjusted or controlled by an area of the second electrode 5a applied. Thus, a desired capacity of the printed capacitor may be obtained by varying an area of application of the second electrode 5a. The second electrode 5a may be formed into any desired configuration and/or pattern. In the illustrated embodiment, the conductive coated layer 5 is formed of a copper/silver paint or a copper/silver paste. The copper/silver paste is so formulated that a primary component of a conductive material thereof consists of copper and its secondary component consists of silver. Copper and silver are formulated at a ratio of 95:5 by the weight. Use of the copper/silver paint having copper and silver incorporated therein at such a ratio not only substantially restrains electrically migration of silver but reduces a manufacturing cost of the circuit board. Thermosetting resin used for the conductive paste for formation of the conductive coated layer 5 is so selected that a calcination temperature of the conductive coated layer 5 or a hardening temperature thereof is reduced as compared with that of the dielectric coated layer 4. Such selection prevents characteristics of the dielectric coated layer 4 from being substantially affected by heat during formation of the conductive coated layer 5. When some means is taken to prevent the affection by the heat, a calcination temperature of the conductive coated layer 5 may be of course set to be higher than that of the dielectric coated layer 4.

A copper foil generally has a flat surface substantially free of roughness. Thus, formation of a copper foil into the first electrode in the illustrated embodiment substantially prevents the first electrode from biting into the dielectric layer, to thereby prevent a reduction in capacity of the printed capacitor, resulting in the printed capacitor exhibiting a relatively increased capacity.

In the illustrated embodiment, the first electrode 2a is formed into a considerably large area as compared with the dielectric layer 4a, resulting in having an exposed portion which is not covered with the dielectric layer 4a, which is seen on a left side of the dielectric layer 4a in FIGS. 1 and 2. The exposed portion of the first electrode 2a acts as a connection land used for electric connection between the circuit board and an upper circuit board arranged on the circuit board.

Figure 2A:
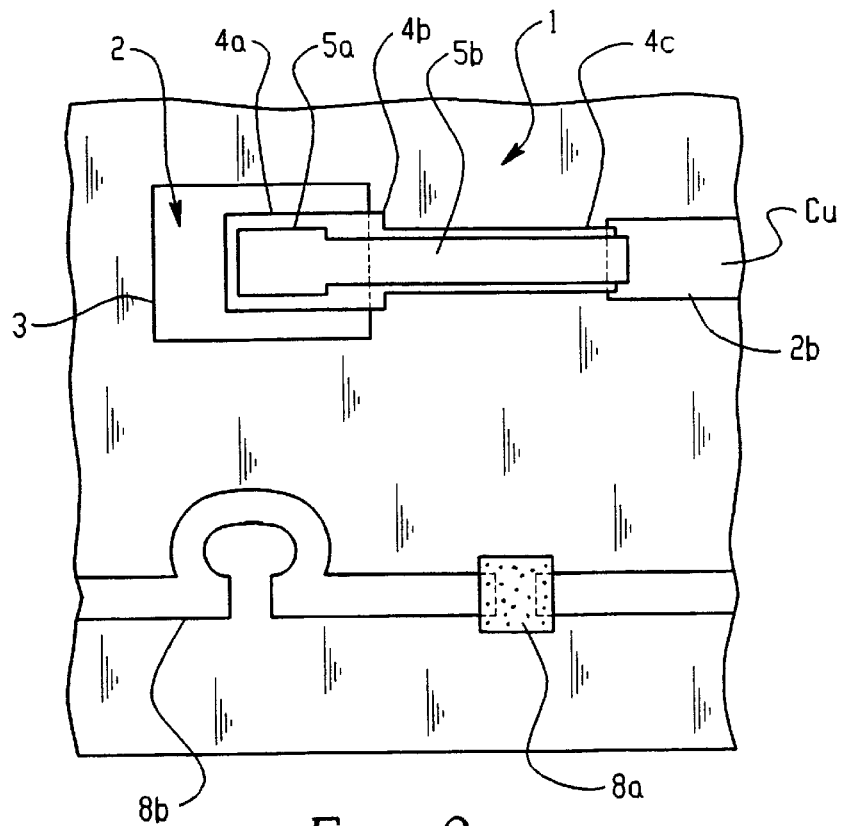
FIG. 2a is a fragmentary plan view showing another embodiment of the invention.

FIG. 2a shows another form of a printed capacitor-mounted circuit board according to the invention. In addition to the printed capacitor 3, printed resistor 8a and inductance 8b are formed on the copper-clad laminate 1. Printed resistors and inductances each may be formed of either a copper foil or a conductive paint.

Also, the illustrated embodiment may be so constructed that the copper-clad laminate 1 is formed on a rear surface thereof with a circuit pattern made of a copper foil or a conductive paint, which is connected to the circuit pattern arranged on the front surface of the laminate 1 via a through conductor arranged so as to extend through the laminate in a thickness direction of the laminate. Such construction permits the circuit to be increased in densification thereof.

Figure 3:
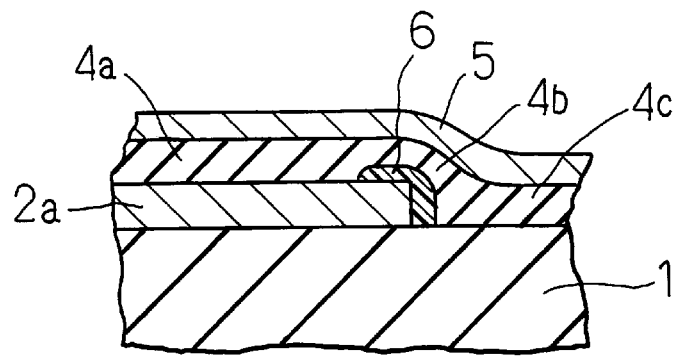
FIG. 3 is a fragmentary enlarged sectional view showing an essential part of a modification of the printed capacitor-mounted circuit board shown in FIG. 1.

In the illustrated embodiment, breaking or cutting of the conductive coated layer 5 due to the angular portion of the end of the first electrode 2a made of a copper foil is prevented by only the extension 4b of the dielectric coated layer 4. Alternatively, it may be realized by a cushioning layer 6 formed of an insulating paint and arranged so as to cover the angular portion of the end of the first electrode 2a as shown in FIG. 3. The cushioning layer 6 exhibits a desired advantage particularly when the dielectric coated layer 4 is reduced in thickness in view of a capacity of the printed capacitor 3. Thus, the cushioning layer 6 may be eliminated when the dielectric coated layer 4 is formed into an increased thickness.

Figure 4A:
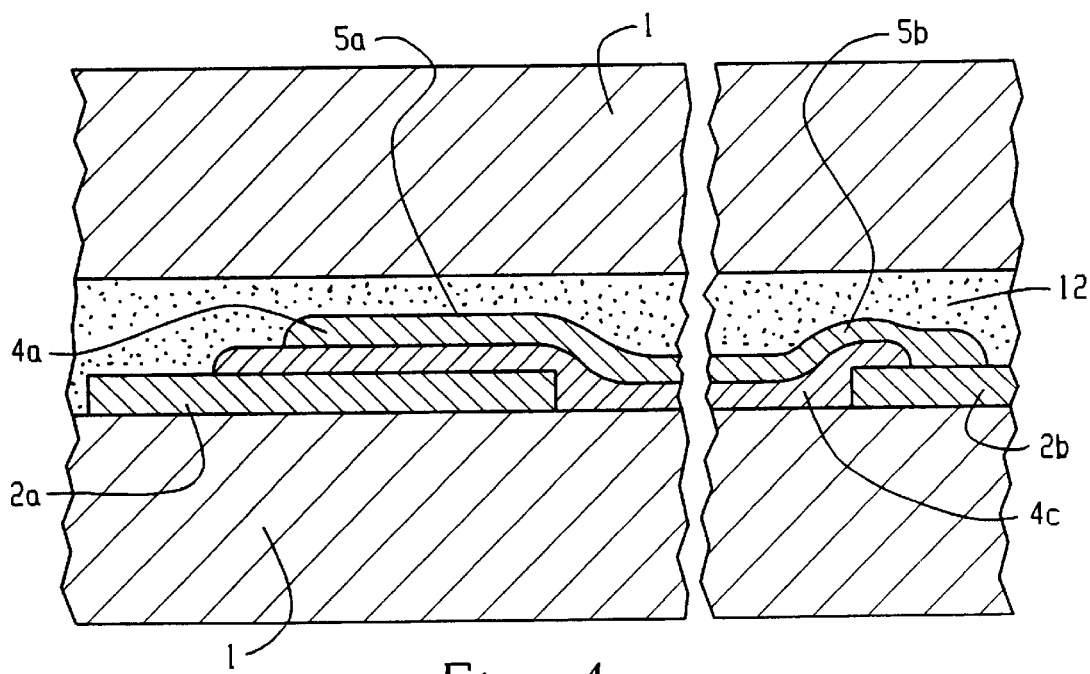
FIG. 4a is a fragmentary sectional view on an enlarged scale showing another embodiment of the invention.
Figure 4:
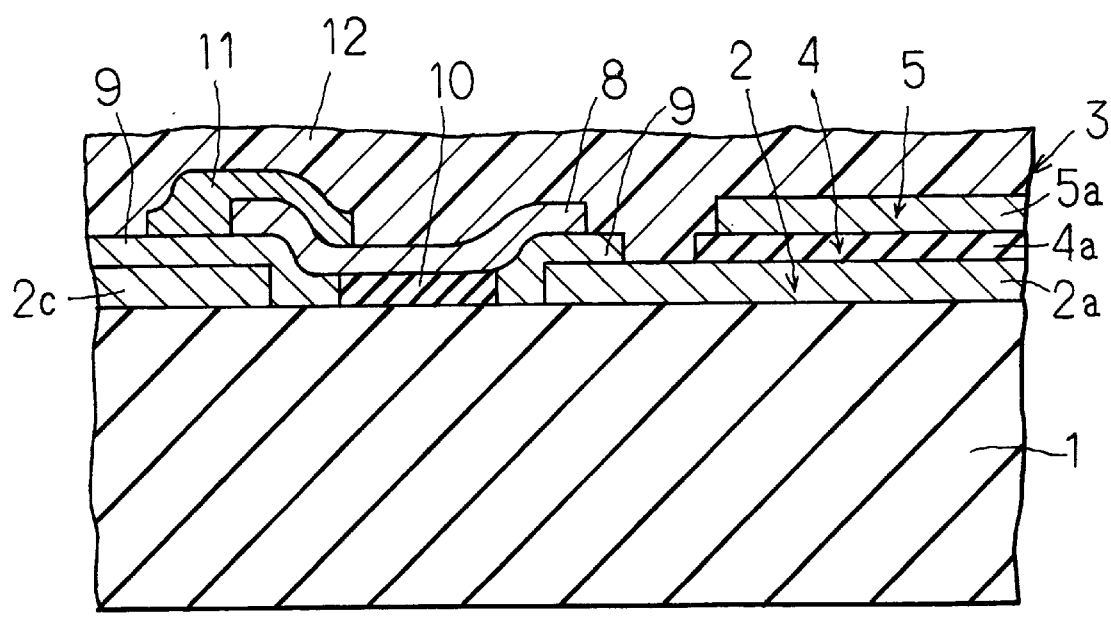
FIG. 4 is a fragmentary enlarged sectional view showing an essential part of another embodiment of a printed capacitor-mounted circuit board according to the present invention.

Referring now to FIG. 4, another embodiment of a printed capacitor-mounted circuit board according to the present invention is illustrated. In the illustrated embodiment, a copper-clad laminate 1 is formed thereon with printed resistors 8. The printed resistors 8 are made by printing a resin paste containing a carbon powder and phenolic resin on the copper-clad laminate 1. Reference characters 2c designates a connection to which each of the printed resistors 8 is connected, 9 is a conductive coated layer, 10 is an undercoat, 11 is an upper electrode for resistance adjustment, and 12 is an overcoat. The conductive coated layer 9 functions to prevent oxidation of a connection surface of each of a first electrode 2a and the connection 2c made of a copper foil and acts as a cushioning layer for preventing breaking or cutting of the printed resistors 8 due to an angular portion of the copper foil. In the illustrated embodiment, the conductive coated layer 9 is made of a conductive paint identical with that for a conductive coated layer 5 providing a second electrode 5a for each of printed capacitors 3. Also, the conductive coated layer 9 is formed concurrently with formation of the conductive coated layer 5. Further, the undercoat 10 of the printed resistor 8 is made of a dielectric paste identical with that for a dielectric coated layer 4 providing a dielectric layer 4a and formed concurrently with formation of the dielectric coated layer 4. Such formation of the conductive coated layer 9 and undercoat 10 reduces the number of times of printing, to thereby substantially reduce a manufacturing cost of the circuit board.

Also, in the illustrated embodiment, the overcoat 12 briefly described above is formed of thermosetting resin such as epoxy resin or the like and arranged on a front surface of the circuit board in a manner to cover the printed resistors 8 and printed capacitors 3. The overcoat 12 functions to mechanically protect each of the various elements of the circuit board described above and acts as a thermal cushioning layer and/or a moisture-proof layer when a multilayered circuit board having the circuit board of the illustrated embodiment incorporated therein is fabricated, resulting in the multilayering being facilitated. The epoxy resin for the overcoat 12 is preferably cured at a temperature lower than a calcination temperature of the dielectric layer of the printed capacitor.

The printed capacitors arranged on the printed capacitor-mounted circuit board each are inherently restricted in capacity, resulting in applications of the printed capacitor-mounted circuit board being limited to a certain degree. In the current stage, the printed capacitor-mounted circuit board is used as a circuit board for digital on which a CPU of a microcomputer or an MPU therefor is mounted by way of example. In such a field, multilayering of a circuit board or construction of a circuit board into a multilayered structure is executed, therefore, it is highly demanded that a multilayered circuit board is constructed of a printed capacitor-mounted circuit board. The printed capacitor-mounted circuit board of the illustrated embodiment permits such a multilayered circuit board to be provided in such a manner that at least one prepreg impregnated with thermo-setting resin such as epoxy resin or the like is arranged on the printed capacitor-mounted circuit board acting as an inner layer and then a rigid substrate acting as an outer layer is arranged on the prepreg to provide a composite, which is heated while being pressurized, leading to formation of the multilayered circuit board. During such fabrication of the multilayered circuit board, heat applied to the printed capacitors and moisture migrated from the resin impregnated in the prepreg to the multilayered circuit board are shielded by the overcoat 12, to thereby be prevented from affecting the printed capacitor-mounted circuit board.

FIG. 4a shows still another embodiment of the invention. The multilayered circuit board assembly includes a capacitor-mounted circuit board provided with overcoat layer 12 which acts as an inner layer on which is located a second rigid insulating substrate layer 1 which acts as an outer layer.

Figure 5:
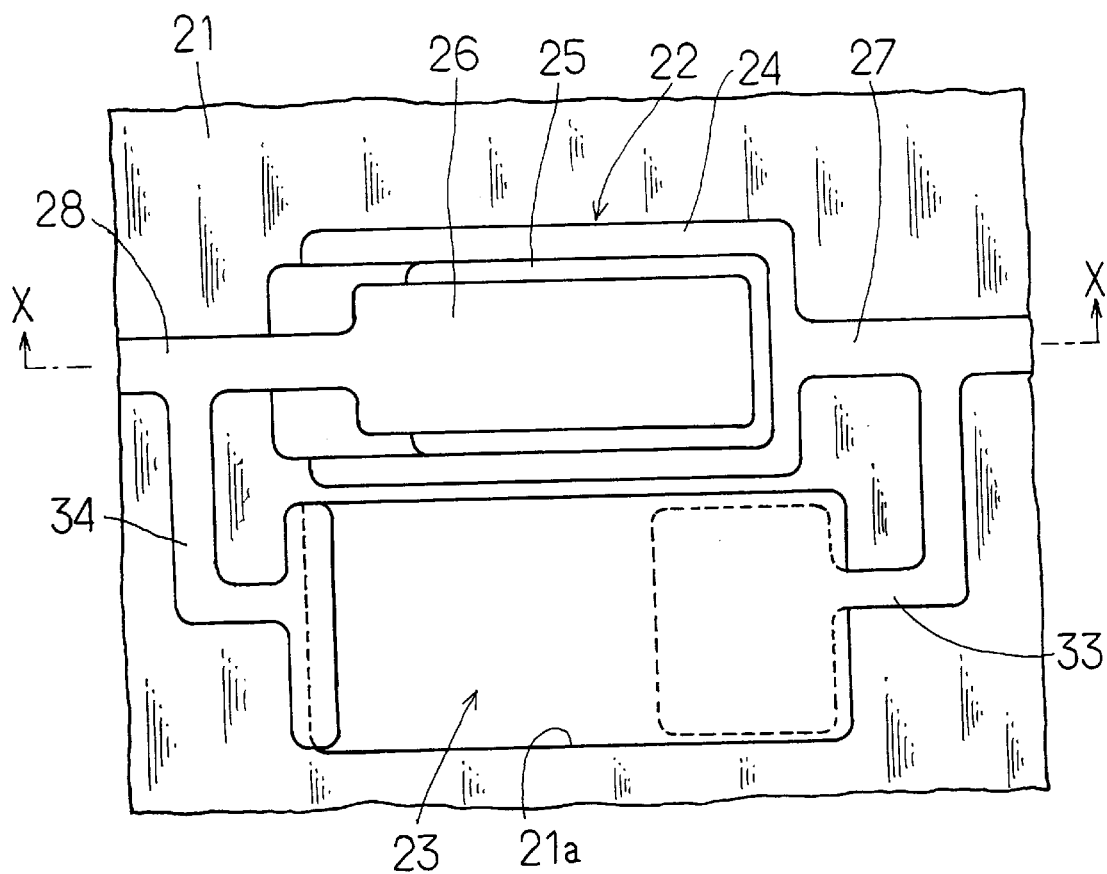
FIG. 5 is a fragmentary enlarged sectional view showing an essential part of a further embodiment of a printed capacitor-mounted circuit board according to the present invention.

Referring now to FIG. 5, a further embodiment of a printed capacitor-mounted circuit board according to the present invention is illustrated. In a printed capacitor-mounted circuit board of the illustrated embodiment, a sheet-like capacitor 23 is arranged on a copper-clad laminate 21 in a manner to be connected in parallel to each of printed capacitors 22 while being in proximity thereto. The printed capacitor 22 may be constructed in substantially the same manner as the printed capacitor 3 shown in each of FIGS. 1 to 3 except a configuration and dimensions thereof. Thus, the printed capacitor 22 includes a first electrode 24, a dielectric layer 25 and a second electrode 26. The first electrode 24 is formed of a copper foil identical with that for a wiring pattern 27 and connected to the wiring pattern 27. The second electrode 26 is formed of a conductive paint identical with that for a wiring pattern 28 and connected to the wiring pattern 28. The copper-clad laminate 21 is covered with an insulating layer 29 (FIG. 6) arranged so as to be positioned between the wiring patterns 27 and 28. The insulating layer 29 is omitted from FIG. 5 for the same of brevity.

Figure 6:
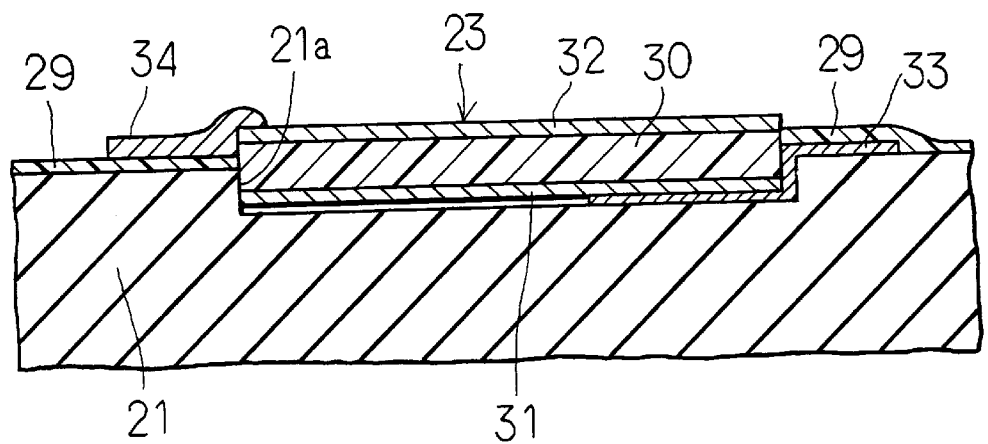
FIG. 6 is a fragmentary enlarged sectional view of the printed capacitor-mounted circuit board shown in FIG. 5.

The sheet-like capacitors 26, as shown in FIG. 6, each are fittedly arranged in each of recesses 21a formed on the copper-clad laminate 21. The sheet-like capacitors 26 each include a sheet-like dielectric layer 30 made of a polyimide resin film, as well as a first sheet-like capacitor electrode 31 provided on one surface of the dielectric layer 30 and a second sheet-like capacitor electrode 32 provided on the other surface of the dielectric layer 30. The sheet-like capacitor 23 is arranged in such a manner that the first sheet-like capacitor electrode 31 faces the recess 21a. The recess 21a is formed into a depth which meets requirements described hereinafter. One of the requirements is that a dimension or thickness of a portion of the sheet-like capacitor 23 projected from a surface of the copper-clad laminate 21 approximates to a thickness of the printed capacitor 22 or is less than the thickness. Another requirement is that a connection electrode 33 described hereinafter is kept from being contacted with the second sheet-like capacitor electrode 32. A further requirement is that a connection pattern 34 described hereinafter is kept from being contacted with the first sheet-like capacitor electrode 31. Still another requirement is that the connection electrode 33 made of a copper foil is kept from being broken or cut during formation of the recess 21a by pressing.

The first sheet-like capacitor electrode 31 is electrically connected to the wiring pattern 27 by means of the connection electrode 33. The connection electrode 33 is formed of a copper foil identical with that for each of the first electrode 24 and wiring pattern 27. The connection electrode 33 is arranged in a manner to extend into the recess 21a of the copper-clad laminate 21 while being branched from the wiring pattern 27. The connection electrode 33 is contacted with the first sheet-like capacitor electrode 31 in the recess 21a. The second sheet-like capacitor electrode 32 is electrically connected to the wiring pattern 28 by means of the connection pattern 34. The connection pattern 34 is made of a conductive paint identical with that for each of the second electrode 26 and wiring pattern 28. The connection pattern 34 is arranged so as to extend onto the second sheet-like capacitor electrode 32 while being branched from the wiring pattern 28 and then is connected to the second sheet-like capacitor electrode 32. The sheet-like capacitor 23 functions to correct or compensate a variation in capacity of the printed capacitor 22. For example, such a variation in capacity of the printed capacitor may be corrected by cutting off a part of the sheet-like capacitor 23 in a recess-like shape to partially remove the sheet-like capacitor 23 in a suitable amount depending on a capacity of the printed capacitor 22, to thereby determine a capacity of the sheet-like capacitor 23, resulting in placing a capacity of the printed capacitor 22 in an allowable range. Also, a capacity of the sheet-like capacitor 23 may be determined by partially removing at least one of the first and second sheet-like capacitor electrodes 31 and 32 of the sheet-like capacitor 23. Further, arrangement of the sheet-like capacitor 23 eliminates a failure in availability of the printed capacitor-mounted circuit board by increasing a capacity of the sheet-like capacitor when the adjustment is failed due to disconnection.

Now, manufacturing of the printed capacitor-mounted circuit board of the illustrated embodiment thus constructed will be described hereinafter.

First, the copper-clad laminate 21 which has the first electrodes 24 and connection electrodes 33 made of the same copper foil and deposited thereon is provided. The copper-clad laminate 21 thus provided is formed with the recesses 21a by pressing while keeping each of the connection electrodes 33 from being broken or cut. Then, the dielectric layers 25 each are deposited on each of the first electrodes 24. Then, each of the recesses 21a is fitted therein with the sheet-like capacitor 23 so as to connect the first sheet-like capacitor electrode 31 and connection electrode 33 to each other. Subsequently, the wiring pattern 28, second electrode 26 and connection pattern 34 are formed of the same conductive paint, resulting in the capacitor-mounted circuit board being completed. The connection electrode 33 may be formed after formation of the recess 21a. In this instance, the connection electrode 33 extending from the wiring pattern 27 into the recess 21a is formed of the conductive paint after formation of the recess 21a. Also, arrangement of the sheet-like capacitor 23 may be carried out after the wiring pattern 28 and second electrode 26 are formed to provide the printed capacitor 22. In this instance, the connection pattern 34 extending from the wiring pattern 28 to the second sheet-like capacitor electrode 32 may be formed of the conductive paint after the sheet-like capacitor 23 is fitted in the recess 21a.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than specifically described.

What is claimed is:

1. A capacitor-mounted circuit board comprising:

an insulating substrate having one or more printed capacitors arranged thereon;

each of said printed capacitors including a first electrode made of a copper foil arranged on said substrate, a dielectric layer made of a dielectric paste arranged on said first electrode, and a second electrode made of a conductive paint arranged on said dielectric layer;

said second electrode connected to a connection made of said copper foil arranged on said substrate by means of a connection line made of said conductive paint; and said dielectric layer includes an extension extending beyond an angular end portion of said first electrode; and a cushioning layer made of an insulating paint being formed on said angular end portion of said first electrode so as to prevent said dielectric layer from being cut thereby.

2. A capacitor-mounted circuit board comprising:

an insulating substrate having one or more printed capacitors arranged thereon;

each of said printed capacitors including a first electrode made of a copper foil arranged on said substrate, a dielectric layer made of a dielectric paste arranged on said first electrode, and a second electrode made of a conductive paint arranged on said dielectric layer;

said second electrode being connected to a connection made of said copper foil arranged on said substrate by means of a connection line made of said conductive paint; and said dielectric layer including an extension thereof extending beyond an angular end portion of said first electrode.

3. A capacitor-mounted circuit board as defined in claim 1, wherein said extension of said dielectric layer is arranged so as to provide an undercoat for said connection line.

4. A capacitor-mounted circuit board as defined in claim 1, wherein at least one of at least one printed resistor and at least one inductance made of a copper foil is formed on said substrate.

5. A capacitor-mounted circuit board as defined in claim 4, wherein said connection which is made of copper foil and to which said printed resistor is connected is provided on said angular end portion thereof with a cushioning layer;

said cushioning layer being made of said conductive paint also used to form said second electrode of one of said printed capacitors; and said printed resistor has an undercoat made of said dielectric paste also used to form said dielectric layer.

6. A capacitor-mounted circuit board as defined in claim 2, wherein said second electrode is made of a copper/silver paste.

7. A capacitor-mounted circuit board as defined in claim 2, wherein said dielectric paste is a mixture of a binder and titanate consisting of barium titanate or strontium titanate; said binder comprising a resin binder.

8. A capacitor-mounted circuit board as defined in claim 2, wherein said printed capacitors has a sheet-like capacitor connected in parallel thereto;

said sheet-like capacitor being fittedly arranged in a recess formed on said insulating substrate in a manner to be in proximity to one of said printed capacitors.

9. A capacitor-mounted circuit board as defined in claim 8, wherein said sheet-like capacitor includes a sheet-like dielectric layer, and first and second sheet-like capacitor electrodes respectively arranged on both surfaces of said dielectric layer; and said sheet-like capacitor is so arranged that said first sheet-like capacitor electrode faces said recess;

said recess being formed therein with a connection electrode which is electrically connected to said first electrode of one of said printed capacitors and electrically connected to said first sheet-like capacitor electrode;

said second sheet-like capacitor electrode and said second electrode of one of said printed capacitors being connected to each other by means of a connection pattern made of said conductive paint.

10. A multilayered circuit board structure comprising:

a plurality of circuit boards laminated on each other;

said circuit boards including a capacitor-mounted circuit board defined in any claim 2 which acts as an inner layer in said multilayered circuit board structure;

said capacitor-mounted circuit board having an overcoat made of epoxy resin arranged so as to cover at least one of said printed capacitors of said capacitor-mounted circuit board.

* * * * *